(12) United States Patent
Fan et al.

(10) Patent No.: US 10,454,073 B2
(45) Date of Patent: Oct. 22, 2019

(54) ORGANIC ELECTROLUMINESCENCE DISPLAY SUBSTRATE AND FABRICATION METHOD THEREOF, DISPLAY PANEL AND DISPLAY DEVICE

(71) Applicant: BOE Technology Group Co., Ltd., Beijing (CN)

(72) Inventors: Xing Fan, Beijing (CN); Guang Yan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/747,838

(22) PCT Filed: Jun. 30, 2017

(86) PCT No.: PCT/CN2017/091189
§ 371 (c)(1),
(2) Date: Jan. 26, 2018

(87) PCT Pub. No.: WO2018/099072
PCT Pub. Date: Jun. 7, 2018

(65) Prior Publication Data
US 2019/0019991 A1    Jan. 17, 2019

(30) Foreign Application Priority Data
Dec. 1, 2016 (CN) .......................... 2016 1 1091447

(51) Int. Cl.
*H01L 51/52* (2006.01)
*H01L 27/32* (2006.01)
*H01L 51/56* (2006.01)

(52) U.S. Cl.
CPC ...... *H01L 51/5275* (2013.01); *H01L 27/3211* (2013.01); *H01L 51/56* (2013.01); *H01L 51/5265* (2013.01); *H01L 2251/5315* (2013.01)

(58) Field of Classification Search
CPC . H01L 51/5275; H01L 27/3211; H01L 51/56; H01L 51/52
(Continued)

(56) References Cited

U.S. PATENT DOCUMENTS 9,431,633 B2    8/2016  Park et al.
9,985,252 B2    5/2018  Lee et al.
(Continued)

FOREIGN PATENT DOCUMENTS

CN    106158905 A    11/2016
JP    2004287053 A    10/2004
(Continued)

OTHER PUBLICATIONS

Aug. 31, 2017—(WO) International Search Report and Written Opinion Appn PCT/CN2017/091189 with English Tran.
(Continued)

*Primary Examiner* — Thinh T Nguyen
(74) *Attorney, Agent, or Firm* — Banner & Witcoff, Ltd.

(57) ABSTRACT

An organic electroluminescence display substrate and a fabrication method thereof, a display panel and a display device are provided. The organic electroluminescence display substrate includes a pixel array and a light extraction layer. The pixel array includes a plurality of pixels, each pixel includes a first sub-pixel emitting light of a first color, and each first sub-pixel includes an organic electroluminescence element. The light extraction layer covers on the pixel array, and at least includes a plurality of first light extraction units and a plurality of second light extraction units having different optical properties. A cathode light-emission side of each first sub-pixel is covered by at least one first light extraction unit and at least one second light extraction unit, or the cathode light-emission sides of two adjacent first
(Continued)

sub-pixels are respectively covered by at least one first light extraction unit and at least one second light extraction unit.

20 Claims, 5 Drawing Sheets

(58) Field of Classification Search
USPC .......................... 257/40, 59, 72; 438/82, 99
See application file for complete search history.

(56) References Cited

U.S. PATENT DOCUMENTS

| | | | | |
|---|---|---|---|---|
| 2010/0001301 | A1* | 1/2010 | Karg et al. | .......... H01L 51/5262 |
| | | | | 257/98 |
| 2014/0145156 | A1* | 5/2014 | Choi et al. | .............. H01L 27/32 |
| | | | | 257/40 |
| 2015/0228929 | A1 | 8/2015 | Lamansky et al. | |
| 2016/0133880 | A1* | 5/2016 | Lee et al. | ............ H01L 51/5281 |
| | | | | 257/40 |
| 2016/0315290 | A1 | 10/2016 | Zhang et al. | |

FOREIGN PATENT DOCUMENTS

| | | |
|---|---|---|
| KR | 1020140069711 A | 6/2014 |
| KR | 1020150046116 A | 4/2015 |
| KR | 1020150076782 A | 7/2015 |
| KR | 101620092 B1 | 5/2016 |
| KR | 20160141060 A | 12/2016 |

OTHER PUBLICATIONS

Jun. 20, 2019—(KR) Office Action application 10-2018-7004407 with English translation.

* cited by examiner

ORGANIC ELECTROLUMINESCENCE DISPLAY SUBSTRATE AND FABRICATION METHOD THEREOF, DISPLAY PANEL AND DISPLAY DEVICE

The application is a U.S. National Phase Entry of International Application No. PCT/CN2017/091189 filed on Jun. 30, 2017, designating the United States of America and claiming priority to Chinese Patent Application No. 201611091447.X filed on Dec. 1, 2016. The present application claims priority to and the benefit of the above-identified applications and the above-identified applications are incorporated by reference herein in their entirety.

TECHNICAL FIELD

Embodiments of the present disclosure relate to an organic electroluminescence display substrate, a display panel, a display device, and a fabrication method of the organic electroluminescence display substrate.

BACKGROUND

Due to advantages such as self-illumination, low power consumption, fast response, flexibility, high contrast, wide viewing angle, ultra-thinness, low cost and the like, an organic electroluminescence element is increasingly favored by people. For example, the organic electroluminescence element includes an anode, a cathode and an organic light emitting layer provided between the anode and the cathode, the anode is provided on a side close to a base substrate, and the cathode is provided on a side away from the base substrate.

According to a light emission direction, the organic electroluminescence element is divided into an organic electroluminescence element of a bottom-emission type, an organic electroluminescence element of a top-emission type and an organic electroluminescence element of a bilateral-emission type. The organic electroluminescence element of the bottom-emission type refers to an organic electroluminescence element whose light is emitted from the side of the base substrate (i.e., an anode emission side), the organic electroluminescence element of the top-emission type refers to an organic electroluminescence element whose light is emitted from the top of the element (i.e., a cathode emission side), and the light-emitting element of the bilateral-emission type refers to an organic electroluminescence element whose light is emitted simultaneously from the side of the base substrate and the top of the element (i.e., the anode emission side and the cathode emission side).

Due to a broad fluorescence spectra of an organic light emitting material, it is necessary to introduce an optical microcavity into the organic electroluminescence element, to narrow a full width at half maximum (FWHM) of the emission spectra by a microcavity resonance effect. However, due to a strong selective effect of the optical microcavity on a wavelength, luminance and color coordinates of the emission light of the organic electroluminescence element of the microcavity type change with a viewing angle, and thus a display effect is affected. Therefore, improving a luminance viewing angle characteristic and/or a chrominance viewing angle characteristic of the organic electroluminescence element is an urgent problem to be solved in a display field.

SUMMARY

The embodiments of the disclosure provide an organic electroluminescence display substrate. The organic electroluminescence display substrate comprises a pixel array and a light extraction layer. The pixel array includes a plurality of pixels arranged in an array, each of the pixels includes a first sub-pixel emitting light of a first color, and each of the first sub-pixels includes an organic electroluminescence element. The light extraction layer covers on the pixel array and at least includes a plurality of first light extraction units and a plurality of second light extraction units, and an optical property of the first light extraction unit and an optical property of the second light extraction unit are different from each other. Cathode light-emission sides of two adjacent first sub-pixels are covered by at least one of the first light extraction units and at least one of the second light extraction units.

The embodiments of the disclosure provide a display panel. The display panel comprises the organic electroluminescence display substrate as described above.

The embodiments of the disclosure provide a display device. The display device comprises the display substrate as described above or the display panel as described above.

The embodiments of the disclosure provide a fabrication method of an organic electroluminescence display substrate. The fabrication method comprises: forming a pixel array and forming a light extraction layer. The pixel array includes a plurality of pixels arranged in an array, each of the pixels includes a first sub-pixel emitting light of a first color, and each of the first sub-pixels includes an organic electroluminescence element. The light extraction layer covers on the pixel array and at least includes a plurality of first light extraction units and a plurality of second light extraction units, an optical property of the first light extraction unit and an optical property of the second light extraction unit are different from each other. Cathode light-emission sides of two adjacent first sub-pixels are covered by at least one of the first light extraction units and at least one of the second light extraction units.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
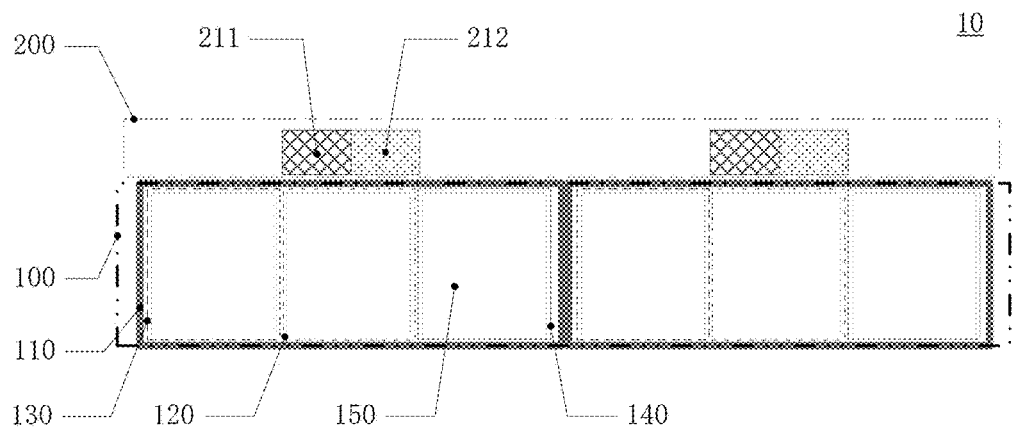
FIG. 1(a) is a cross-sectional schematic diagram of a structure of an organic electroluminescence display substrate provided by embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. In addition, in the embodiments of the disclosure, same or similar references represent same or similar references.

Embodiments of the present disclosure provide an organic electroluminescence display substrate, a display panel, a display device, and a fabrication method of the organic electroluminescence display substrate; the organic electroluminescence display substrate, by providing at least two light extraction units with optical properties different from each other, implements improvement of a luminance viewing angle characteristic and/or a chrominance viewing angle characteristic.

At least one embodiment of the present disclosure provides the organic electroluminescence display substrate, the organic electroluminescence display substrate comprising a pixel array and a light extraction layer. The pixel array includes a plurality of pixels arranged in an array, each pixel includes a first sub-pixel emitting light of a first color, and each first sub-pixel includes an organic electroluminescence element; the light extraction layer covers on the pixel array, and for example, at least includes a plurality of first light extraction units and a plurality of second light extraction units arranged in parallel, an optical property of the first light extraction unit and an optical property of the second light extraction unit are different from each other; cathode light-emission sides of two adjacent first sub-pixels are covered by at least one of the first light extraction units and at least one of the second light extraction units. For example, the cathode light-emission side of each first sub-pixel is covered by at least one of the first light extraction units and at least one of the second light extraction units, or the cathode light-emission sides of two adjacent first sub-pixels are respectively covered by at least one of the first light extraction units and at least one of the second light extraction units.

For example, in the embodiments of the present disclosure, the expression of "two adjacent first sub-pixels" indicates that there is no other first sub-pixel included between the above-described two adjacent first sub-pixels, but neither limits that the above-described two adjacent first sub-pixels need to be in physical contact, nor limits that other sub-pixel other than the first sub-pixel is not provided between the above-described two adjacent first sub-pixels. For example, in the case that that each pixel only includes the first sub-pixel, there is not provided any sub-pixel including the first sub-pixel between the two adjacent first sub-pixels; and for another example, in the case that each pixel includes the first sub-pixel, a second sub-pixel, and a third sub-pixel, a second sub-pixel and/or a third sub-pixel may further be provided between the two adjacent first sub-pixels.

The cathode light-emission side of the organic electroluminescence element is covered by the light extraction unit, the number of surface plasma polaritons near a cathode electrode is decreased, so energy dissipation of light near the cathode electrode is decreased, and effective transmissivity of the cathode electrode is increased. The light extraction units with different thicknesses and/or different refractive indexes allow the cathode electrode to have different effective transmissivities and reflectivities, so changes of luminance and color coordinates (chrominance) of the organic electroluminescence element with a viewing angle variation are also different. By introducing at least two light extraction units and by utilizing an average effect of the at least two light extraction units on light emission luminance and the color coordinates, it is possible to implement improvement of a luminance viewing angle characteristic and/or a chrominance viewing angle characteristic of the organic electroluminescence element and the organic electroluminescence display substrate.

For example, FIG. 1(a) is a cross-sectional schematic diagram of a structure of the organic electroluminescence display substrate 10 provided by the embodiments of the present disclosure. As shown in FIG. 1(a), the organic electroluminescence display substrate 10 comprises a pixel array 100 and a light extraction layer 200. The pixel array 100 includes a plurality of pixels 110 arranged in an array (a one-dimensional array or a two-dimensional array); each pixel 110 includes a first sub-pixel 120 emitting light of a first color, and each first sub-pixel 120 includes an organic electroluminescence element 150 is an organic electroluminescence element of top-emission type or an organic electroluminescence element of bilateral-emission type. For example, the pixel 110 only includes the first sub-pixel 120 emitting light of the first color; and for another example, according to an actual need, the pixel 110 further includes a second sub-pixel 130 emitting light of a second color and a third sub-pixel 140 emitting light of a third color, each second sub-pixel 130 and each third sub-pixel 140 include the organic electroluminescence element 150, which will not be specifically limited in the present disclosure. For example, the light extraction layer 200 covers on the pixel array 100, and includes a plurality of first light extraction units 211 and a plurality of second light extraction units 212 arranged in parallel, for example, the first light extraction unit 211 and the second light extraction unit 212 have a same thickness but different refractive indexes. A cathode light-emission side of each first sub-pixel 120 is covered by one of the first light extraction units 211 and one of the second light extraction units 212.

Figure 1B:
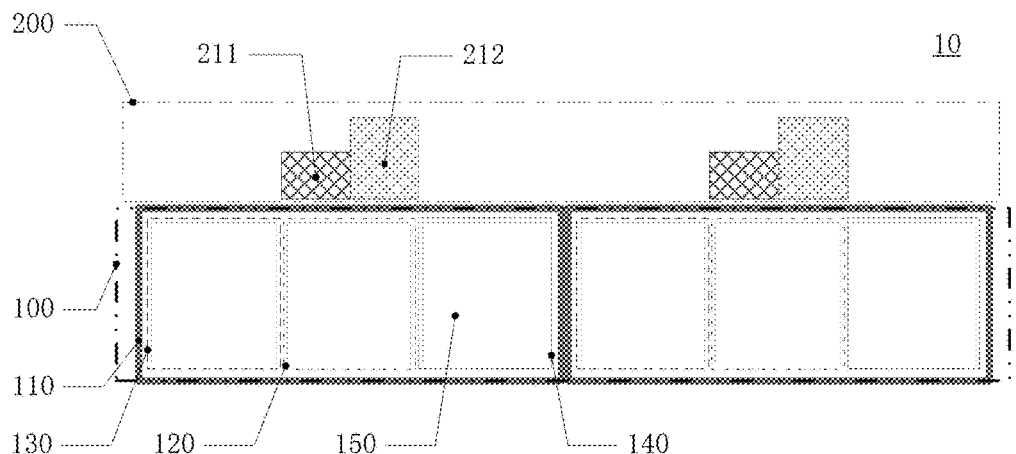
FIG. 1(b) is a cross-sectional schematic diagram of another structure of the organic electroluminescence display substrate provided by the embodiments of the present disclosure.

FIG. 1(b) is a cross-sectional schematic diagram of another structure of the organic electroluminescence display substrate provided by the embodiments of the present disclosure. As shown in FIG. 1(b), the organic electroluminescence display substrate 10 differs from the organic electroluminescence display substrate 10 shown in FIG. 1(a) in that the first light extraction unit 211 and the second light extraction unit 212 have different thicknesses. Since the first light extraction unit 211 and the second light extraction unit 212 are made of a same material, so a preparation process of the light extraction layer 200 shown in FIG. 1(b) is simpler than a preparation process of the light extraction layer 200 shown in FIG. 1(a).

Figure 1C:
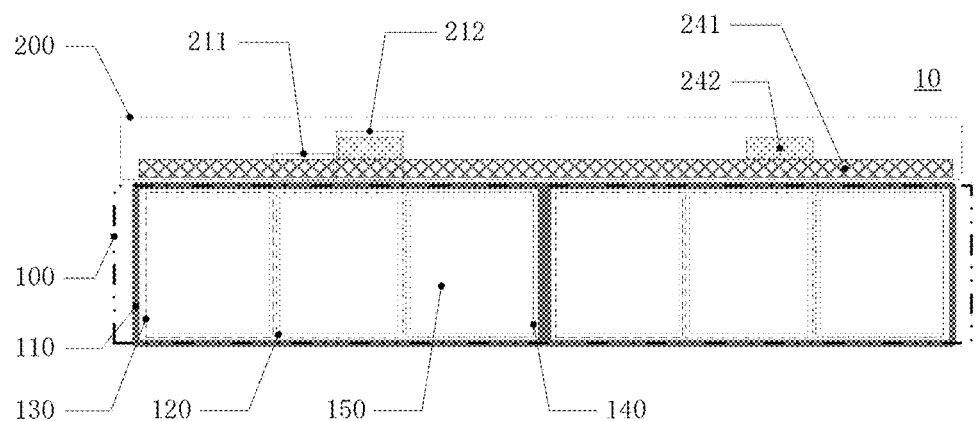
FIG. 1(c) is a cross-sectional schematic diagram of still another structure of the organic electroluminescence display substrate provided by the embodiments of the present disclosure.

FIG. 1(c) is a cross-sectional schematic diagram of still another structure of the organic electroluminescence display substrate provided by the embodiments of the present disclosure. As shown in FIG. 1(c), the first light extraction unit 211 and the second light extraction unit 212 of the organic electroluminescence display substrate 10 have different thicknesses and coverage areas. The organic electroluminescence display substrate 10 differs from the organic electroluminescence display substrate 10 shown in FIG. 1(b) in that the light extraction layer is formed in different modes, the first light extraction unit 211 and the second light extraction unit 212 shown in FIG. 1(c) include a first unit layer 241 and the second light extraction unit 212 further includes a second unit layer 242, and the second unit layer 242 covers on the first unit layer 241.

For example, a preparation method of the first light extraction unit 211 and the second light extraction unit 212 shown in FIG. 1(c) is that: firstly, the first unit layer 241 is formed on the cathode light-emission side of the pixel array 100, and then, the second unit layer 242 is formed in a region corresponding to the second light extraction unit 212, so as to implement that the first light extraction unit 211 and the second light extraction unit 212 with different thicknesses cover on a same sub-pixel. As a result, the thicknesses of the first light extraction unit 211 and the second light extraction unit 212 are more finely controlled, and the process of fabricating the first light extraction unit 211 and the second light extraction unit 212 is further simplified.

For example, the first light extraction unit 211 and the second light extraction unit 212 shown in FIG. 1(c) are formed with fine metal masks. For example, the first light extraction unit 211 and the second light extraction unit 212 shown in FIG. 1(c) are made, for example, of an organic material such as 8-hydroxyquinoline aluminum ($Alq_3$), or are made, for example, of an inorganic material such as titanium dioxide ($TiO_2$), magnesium oxide (MgO), magnesium fluoride ($MgF_2$), silicon dioxide ($SiO_2$), or are made of other suitable materials, and the formed light extraction units are capable of extracting light and are capable of improving the luminance viewing angle characteristic and/or the chrominance viewing angle characteristic.

Hereinafter, influence of the light extraction units with different refractive indexes on the change of the luminance of the organic electroluminescence element with the viewing angle variation, and a principle of improving the luminance viewing angle characteristic of the organic electroluminescence display substrate 10 shown in FIG. 1(a) by providing at least two light extraction units with different refractive indexes will be described in conjunction with a simulation result in FIG. 2(a).

Figure 2A:
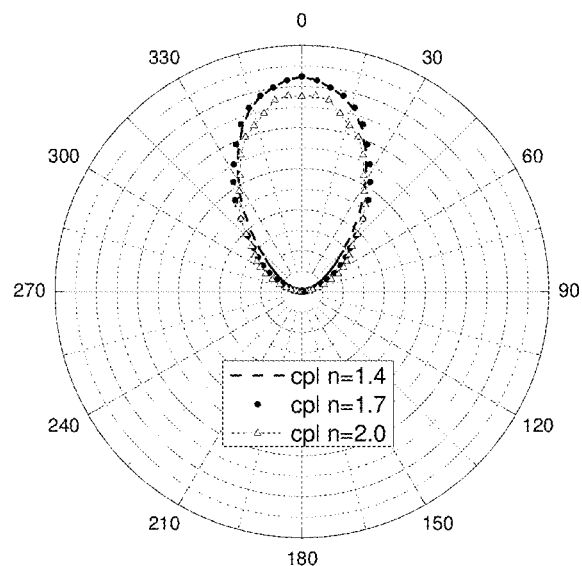
FIG. 2(a) is a Lambertian view of influence of different refractive indexes of a light extraction unit on a change of a luminance of an organic electroluminescence element with a viewing angle variation.

A Lambertian view shown in FIG. 2(a) shows the influence of the refractive index of the light extraction unit (denoted by cpl in the drawing) on the change of red light luminance of the organic electroluminescence element 150 with the viewing angle variation, and at this time, the thickness of the light extraction layer is 55 nm (i.e., 55 nanometers). As shown in FIG. 2(a), in the case that the refractive index of the light extraction unit is relatively small (for example, n=1.4), the luminance of the organic electroluminescence element 150 is relatively strong at a viewing angle of zero (i.e., in front), the luminance rapidly decreases as the viewing angle increases, and the luminance at a large viewing angle is relatively weak; in the case that the refractive index of the light extraction unit is relatively large (for example, n=2), the luminance of the organic electroluminescence element 150 is relatively weak at the viewing angle of zero (i.e., in front), the luminance decreases slowly as the viewing angle increases, and the luminance at the large viewing angle is relatively strong.

In the case where the organic electroluminescence element 150 are covered by two light extraction units with different refractive indexes, since the two light extraction units are provided on the same organic electroluminescence element 150, effective light emission luminance of the organic electroluminescence element 150 is (light emission luminance if only the first unit layer is provided×width of the first light extraction unit 211+light emission luminance if only the second unit layer is provided×width of the second light extraction unit 212)/(width of the first light extraction unit 211+width of the second light extraction unit 212). For example, in a case where the width of the first light extraction unit 211 and the width of the second light extraction unit 212 are the same, the effective light emission luminance of the organic electroluminescence element 150 is half the sum of the above-described two light emission luminances. Thus, in a case where one light extraction unit having relatively high luminance at the small viewing angle and having relatively low luminance at the large viewing angle, and the other light extraction unit having relatively low luminance at the small viewing angle and having relatively high luminance at the large viewing angle are provided on the same organic electroluminescence element 150, change of the luminance of the organic electroluminescence element 150 with the viewing angle variation becomes slow, so that it is possible to improve the luminance viewing angle characteristic of the organic electroluminescence element 150, and further it is possible to improve the luminance viewing angle characteristic of the organic electroluminescence display substrate 10 shown in FIG. 1(a).

Hereinafter, influence of the light extraction units with different refractive indexes on the change of red light color coordinates of the organic electroluminescence element 150 with the viewing angle variation, and a principle of improving the chrominance viewing angle characteristic of the organic electroluminescence display substrate 10 shown in FIG. 1(*a*) by providing at least two light extraction units with different refractive indexes will be illustrated in conjunction with a simulation result in Table 1.

Table 1 shows the influence of the light extraction unit with different refractive indexes on the change of the color coordinates of the organic electroluminescence element 150 with the viewing angle variation, CIEx and CIEy represent the color coordinates of the light emitted by the organic electroluminescence element 150, and Δu'Δv' represents a color shift of the organic electroluminescence element 150 with respect to a zero-degree viewing angle.

TABLE 1

| Refractive index | Angle | CIEx | CIEy | Δu'Δv' |
|---|---|---|---|---|
| 1.4 + 2 | 0 | 0.6348 | 0.3562 | 0 |
|  | 30 | 0.6231 | 0.3678 | 0.018953 |
|  | 60 | 0.6248 | 0.3686 | 0.018374 |
| 1.4 | 0 | 0.629104 | 0.344556 | 0 |
|  | 30 | 0.606199 | 0.36185 | 0.03284 |
|  | 60 | 0.538779 | 0.411725 | 0.114858 |
| 1.7 | 0 | 0.631645 | 0.342832 | 0 |
|  | 30 | 0.617112 | 0.356856 | 0.023984 |
|  | 60 | 0.538779 | 0.411725 | 0.118496 |
| 2 | 0 | 0.627435 | 0.346448 | 0 |
|  | 30 | 0.61708 | 0.358883 | 0.019072 |
|  | 60 | 0.610311 | 0.370266 | 0.033674 |

As shown in Table 1, in a case where only one light extraction unit is covered on the organic electroluminescence element 150, the color shift at the large viewing angle (for example, 60°) is relatively large; and in a case where two light extraction units respectively having refractive indexes of 1.4 and 2 are covered on the same organic electroluminescence element 150, the color shift at the large viewing angle is relatively small. Therefore, by providing two light extraction units with different refractive indexes on the same organic electroluminescence element 150, it is possible to implement improvement of the chrominance viewing angle characteristic of the organic electroluminescence element 150, and further it is possible to improve the chrominance viewing angle characteristic of the organic electroluminescence display substrate 10 shown in FIG. 1(*a*).

Hereinafter, influence of light extraction units with different thicknesses on the change of the luminance of the organic electroluminescence element 150 with the viewing angle variation, and a principle of improving the luminance viewing angle characteristic of the organic electroluminescence display substrate 10 shown in FIG. 1(*b*) and FIG. 1(*c*) by providing at least two light extraction units with different thicknesses will be illustrated in conjunction with a simulation result in FIG. 2(*b*).

Figure 2B:
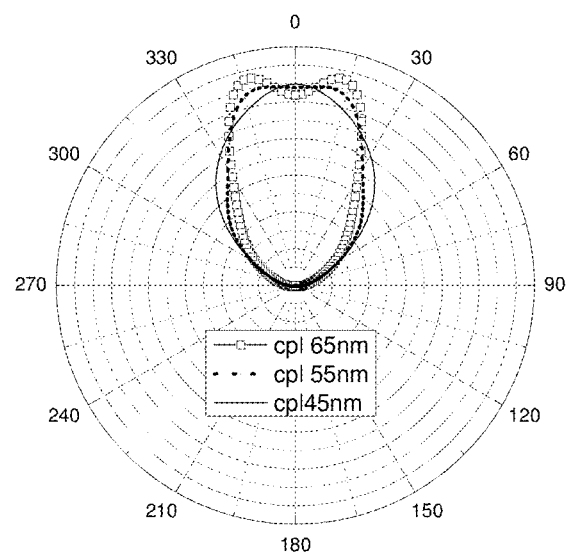
FIG. 2(b) is a Lambertian view of influence of different thicknesses of the light extraction unit on a change of the luminance of the organic electroluminescence element with the viewing angle variation.

The Lambertian view shown in FIG. 2(*b*) shows the influence of the thickness of the light extraction unit (denoted by cpl in the diagram) on the change of green light luminance with the viewing angle variation, and at this time, the refractive index of the light extraction layer is 1.8. As shown in FIG. 2(*b*), in the case that the thickness of the light extraction unit is 45 nanometers, the luminance of the organic electroluminescence element 150 at the large viewing angle is relatively weak; and in the case that the thickness of the light extraction unit is 65 nanometers, the luminance of the organic electroluminescence element 150 at the large viewing angle is relatively strong. Therefore, by providing two light extraction units with different thicknesses on the same organic electroluminescence element 150, it is possible to implement improvement of the luminance viewing angle characteristic of the organic electroluminescence element 150, and further it is possible to improve the luminance viewing angle characteristic of the organic electroluminescence display substrate 10 shown in FIG. 1(*b*) and FIG. 1(*c*).

Hereinafter, influence of the light extraction units with different thicknesses on the change of green light color coordinates of the organic electroluminescence element 150 with the viewing angle variation, and a principle of improving the chrominance viewing angle characteristic of the organic electroluminescence display substrate 10 shown in FIG. 1(*b*) and FIG. 1(*c*) by providing at least two light extraction units with different thicknesses will be illustrated in conjunction with a simulation result in Table 2.

Table 2 shows the influence of the light extraction units with different thicknesses on the change of the color coordinates of the organic electroluminescence element 150 with the viewing angle variation.

TABLE 2

|  | Angle | CIEx | CIEy | Δu'Δv' |
|---|---|---|---|---|
| 45 nm + 65 nm | 0 | 0.2412 | 0.7136 | 0 |
|  | 60 | 0.2299 | 0.7084 | 0.004348 |
| 45 nm | 0 | 0.235791 | 0.703793 | 0 |
|  | 60 | 0.179651 | 0.701432 | 0.021888 |
| 55 nm | 0 | 0.227508 | 0.706337 | 0 |
|  | 60 | 0.203398 | 0.694228 | 0.009436 |
| 65 nm | 0 | 0.215614 | 0.713421 | 0 |
|  | 60 | 0.23029 | 0.681098 | 0.009705 |

As shown in Table 2, in a case where only one light extraction unit is covered on the organic electroluminescence element 150, the color shift at the large viewing angle is relatively large; and in a case where two light extraction units respectively having thicknesses of 45 nanometer and 60 nanometer cover on the same organic electroluminescence element 150, the color shift at the large viewing angle is relatively small. Therefore, by providing two light extraction units with different thicknesses on the same organic electroluminescence element 150, it is possible to implement improvement of the chrominance viewing angle characteristic of the organic electroluminescence element 150, and further it is possible to improve the chrominance viewing angle characteristic of the organic electroluminescence display substrate 10 shown in FIG. 1(*b*) and FIG. 1(*c*).

For example, the organic electroluminescence display substrate 10 further comprises a second sub-pixel 130 emitting light of a second color and a third sub-pixel 140 emitting light of a third color, each second sub-pixel 130 and each third sub-pixel 140 includes the organic electroluminescence element 150.

Figure 3:
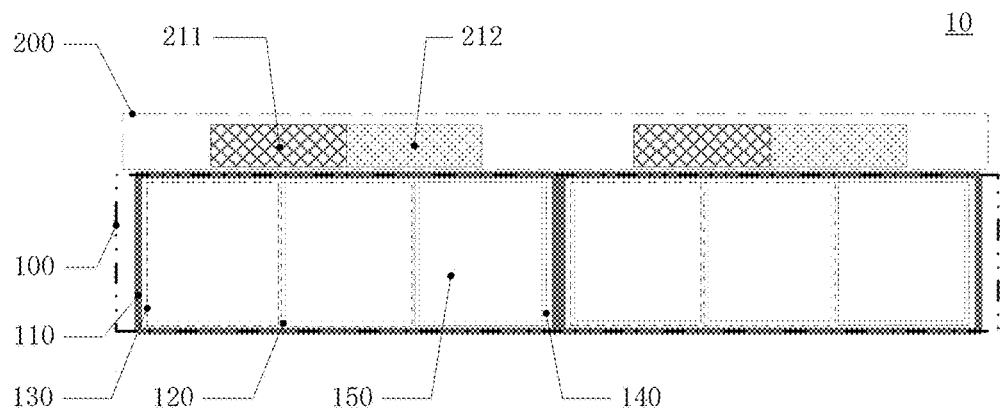
FIG. 3 is a cross-sectional schematic diagram of still another structure of the organic electroluminescence display substrate provided by the embodiments of the present disclosure.

For example, FIG. 3 is a cross-sectional schematic diagram of still another structure of the organic electroluminescence display substrate 10 provided by the embodiments of the present disclosure. As shown in FIG. 3, the organic electroluminescence display substrate 10 differs from the organic electroluminescence display substrate 10 shown in FIG. 1 in that the first light extraction unit 211 and the second light extraction unit 212 not only cover the cathode light-emission side of the first sub-pixel 120, but also at least partially covers cathode light-emission sides of the adjacent second sub-pixel 130 and the adjacent third sub-pixel 140, respectively. Since the cathode light-emission side of the first sub-pixel 120 is covered by the first light extraction unit 211 and the second light extraction unit 212 with different refractive indexes or different thicknesses, it is possible to improve the luminance viewing angle characteristics and/or the chrominance viewing angle characteristics of the light of the first color of the organic electroluminescence display substrate 10. Since the widths of the first light extraction unit 211 and the second light extraction unit 212 are increased, difficulty in fabricating the light extraction layer 200 is reduced.

Figure 4:
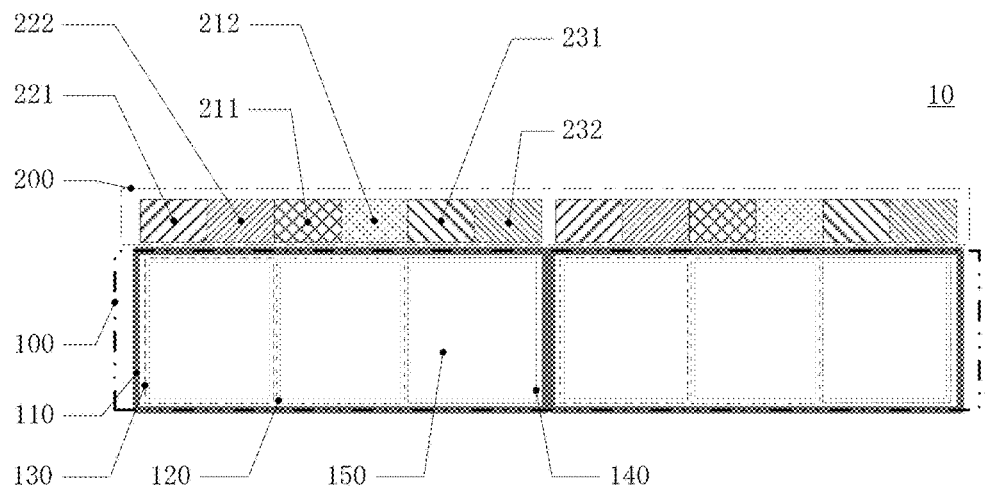
FIG. 4 is a cross-sectional schematic diagram of still another structure of the organic electroluminescence display substrate provided by the embodiments of the present disclosure.

For example, FIG. 4 is a cross-sectional schematic diagram of still another structure of the organic electroluminescence display substrate provided by the embodiments of the present disclosure. As shown in FIG. 4, the organic electroluminescence display substrate 10 differs from the organic electroluminescence display substrate 10 shown in FIG. 1 in that the light extraction layer 200 further includes a plurality of third light extraction units 221 and a plurality of fourth light extraction unit 222 arranged in parallel. An optical property of the third light extraction unit 221 and an optical property of the fourth light extraction unit 222 are different from each other, for example, the third light extraction unit 221 and the fourth light extraction unit 222 have different refractive indexes or different thicknesses. The cathode light-emission side of each second sub-pixel 130 is covered by one third light extraction unit 221 and one fourth light extraction unit 222. Since the cathode light-emission side of the second sub-pixel 130 is covered by one third light extraction unit 221 and one fourth light extraction unit 222, the luminance viewing angle characteristic and/or the chrominance viewing angle characteristic of the light of the second color of the organic electroluminescence display substrate 10 are also improved.

For example, as shown in FIG. 4, the organic electroluminescence display substrate 10 further comprises a plurality of fifth light extraction units 231 and a plurality of sixth light extraction units 232 arranged in parallel. An optical property of the fifth light extraction unit 231 and an optical property of the sixth light extraction unit 232 are different from each other, for example, the fifth light extraction unit 231 and the sixth light extraction unit 232 have different refractive indexes or different thicknesses. The cathode light-emission side of each third sub-pixel 140 is covered by one fifth light extraction unit 231 and one sixth light extraction unit 232. Since the cathode light-emission side of the third sub-pixel 140 is covered by one fifth light extraction unit 231 and one sixth light extraction unit 232, the luminance viewing angle characteristic and/or the chrominance viewing angle characteristic of the light of the third color of the organic electroluminescence display substrate 10 are also improved.

Since the light extraction layer 200 shown in FIG. 4 have two light extraction units with different optical properties provided respectively with respect to the first sub-pixel 120, the second sub-pixel 130 and the third sub-pixel 140, the luminance viewing angle characteristics and/or the chrominance viewing angle characteristics of the light of the first color, the light of the second color and the light of the third color are better improved.

For example, in order to reduce process complexity of the organic electroluminescence display substrate 10, thicknesses and refractive indexes of the first light extraction unit, the third light extraction unit and the fifth light extraction unit shown in FIG. 4 are set to be same; for another example, thicknesses and refractive indexes of the second light extraction unit, the fourth light extraction unit and the sixth light extraction unit shown in FIG. 4 are set to be same.

For example, in order to improve the luminance viewing angle characteristics and/or the chrominance viewing angle characteristics of the light of the first color, the light of the second color and the light of the third color to a largest extent, the thicknesses and the refractive indexes of the first light extraction unit, the third light extraction unit and the fifth light extraction unit shown in FIG. 4 are set to be different from each other; and the thicknesses and the refractive indexes of the second light extraction unit, the fourth light extraction unit and the sixth light extraction unit shown in FIG. 4 are set to be different from each other.

Figure 5:
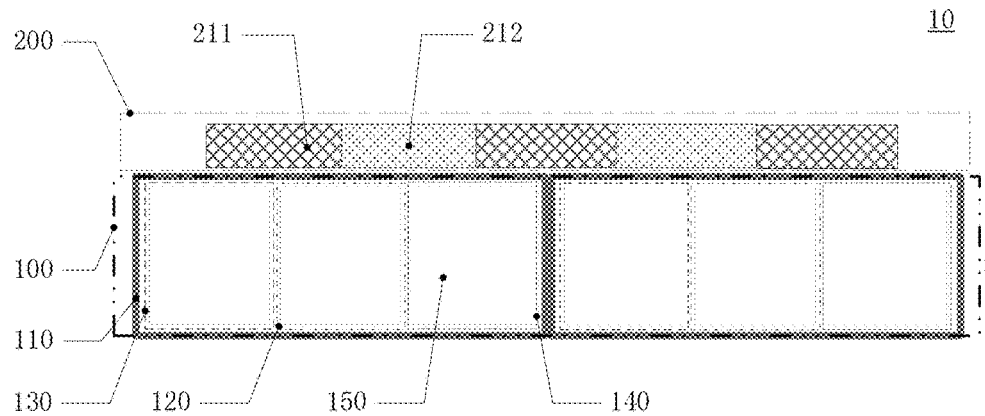
FIG. 5 is a cross-sectional schematic diagram of still another structure of the organic electroluminescence display substrate provided by the embodiments of the present disclosure.

For example, FIG. 5 is a cross-sectional schematic diagram of still another structure of the organic electroluminescence display substrate 10 provided by the embodiments of the present disclosure. As shown in FIG. 5, the organic electroluminescence display substrate 10 differs from the organic electroluminescence display substrate 10 shown in FIG. 1 in that: the organic electroluminescence display substrate 10 shown in FIG. 5 further comprises the second sub-pixel 130 emitting light of the second color and the third sub-pixel 140 emitting light of the third color, each second sub-pixel 130 and each third sub-pixel 140 include the organic electroluminescence element 150. Each second sub-pixel 130 is covered by the first light extraction unit 211 and the second light extraction unit 212, and each third sub-pixel 140 is covered by the first light extraction unit 211 and the second light extraction unit 212; and the cathode light-emission sides of any two adjacent sub-pixels among the first sub-pixels 120, the second sub-pixels 130 and the third sub-pixels 140 are at least partially covered by a same first light extraction unit 211 or a same second light extraction unit 212, so that each of the first sub-pixel 120, the second sub-pixel 130 and the third sub-pixel 140 is covered by at least two light extraction layers of different optical properties.

For example, in the organic electroluminescence display substrate 10 shown in FIG. 5, the first sub-pixel 120 and the second sub-pixel 130 adjacent to each other on the left side of FIG. 5 are partially covered by the same first light extraction unit 211, and the first sub-pixel 120 and the second sub-pixel 130 adjacent to each other on the right side of FIG. 5 are partially covered by the same second light extraction unit 212; the first sub-pixel 120 and the third sub-pixel 140 on the left side of FIG. 5 are partially covered by the same second light extraction unit 212; the first sub-pixel 120 and the third sub-pixel 140 on the right side of FIG. 5 are partially covered by the same first light extraction unit 211. Since each of the first sub-pixel 120, the second sub-pixel 130 and the third sub-pixel 140 is covered by two light extraction units with different optical properties, the luminance viewing angle characteristics and/or the chrominance viewing angle characteristics of the light of the first color, the light of the second color and the light of the third color are all be improved. Since one light extraction unit is shared by every two sub-pixels, the width of the light extraction unit is increased, so that difficulty in fabricating the light extraction layer 200 is reduced.

For example, the light extraction layer shown in FIG. 5 is not limited to have only two light extraction units (i.e. the first light extraction unit and the second light extraction unit) provided, and it may have more light extraction units with optical properties different from one another provided. For example, three light extraction units (the first light extraction unit, the second light extraction unit and a seventh light extraction unit) are provided, and in this case, the first sub-pixel and the second sub-pixel adjacent to each other are partially covered by the same first light extraction unit, the first sub-pixel and the third sub-pixel adjacent to each other are partially covered by the same second light extraction unit, and the third sub-pixel and the second sub-pixel adjacent to each other are partially covered by the same seventh light extraction unit (not shown in FIG. 5). Therefore, the number of light extraction units to be provided is not limited in the present application.

Figure 6:
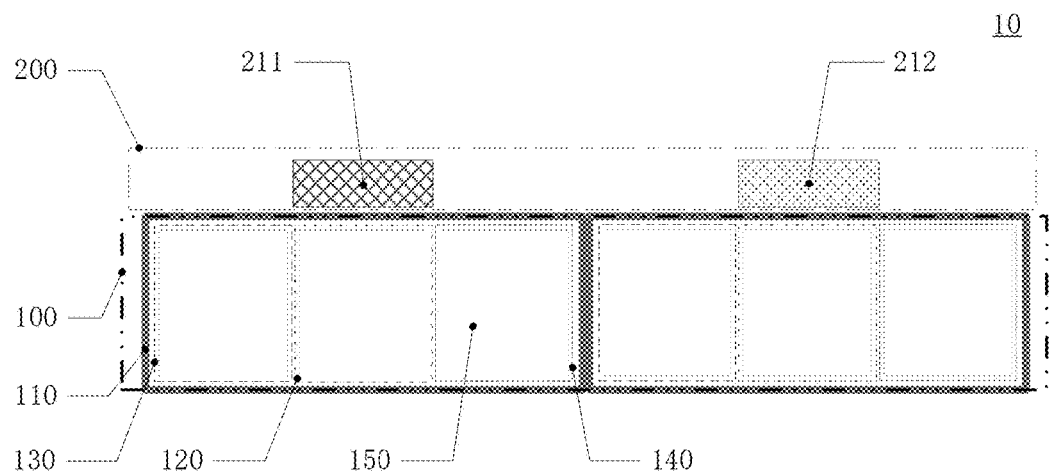
FIG. 6 is a cross-sectional schematic diagram of still another structure of the organic electroluminescence display substrate provided by the embodiments of the present disclosure.

For example, FIG. 6 is a cross-sectional schematic diagram of still another structure of the organic electroluminescence display substrate provided by the embodiments of the present disclosure. As shown in FIG. 6, the organic electroluminescence display substrate 10 comprises the pixel array 100 and the light extraction layer 200. The pixel array 100 includes the plurality of pixels 110 arranged in the array, each pixel 110 includes the first sub-pixel 120 emitting light of the first color, and each first sub-pixel 120 includes the organic electroluminescence element 150; the organic electroluminescence element 150 for example is the organic electroluminescence element of top-emission type or the organic electroluminescence element of bilateral-emission type. The light extraction layer 200 covers on the pixel array 100, and includes the plurality of first light extraction units 211 and the plurality of second light extraction units 212 arranged in parallel, the first light extraction unit 211 and the second light extraction unit 212 have different thicknesses or refractive indexes. The cathode light-emission sides of two adjacent first sub-pixels 120 are respectively covered by at least one of the first light extraction units 211 and at least one of the second light extraction units 212.

Figure 7:
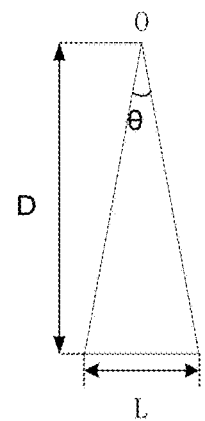
FIG. 7 is a principle diagram of calculating a minimum resolving distance of a human eye.

Hereinafter, a principle of improving the luminance viewing angle characteristic and/or the chrominance viewing angle characteristic of the organic electroluminescence display substrate 10 shown in FIG. 6 will be illustrated in conjunction with FIG. 7. Point O represents a pupil center of an eye, θ represents a minimum angle (about 1') of two points that are distinguished by the eye with respect to the pupil center, D represents a distance from the eye to a display screen (such distance of a mobile phone is usually 25 cm), L is a minimum distance (usually greater than 0.1 mm) that is distinguished by the eye. With respect to the mobile phone with resolution of QHD, a distance between two adjacent sub-pixels of a same color is less than 0.04 mm (which is about 0.02 mm for green). Thus, the human eyes are unable to distinguish two adjacent sub-pixels of the same color of the mobile phone with resolution of QHD (quarter of resolution of full high definition of 1920*1080), and deem the two adjacent sub-pixels of the same color of the mobile phone with resolution of QHD as a same light-emitting point. Therefore, with respect to the organic electroluminescence display substrate 10 shown in FIG. 6, it is equivalent to a case where the first light extraction units 211 and the second light extraction unit 212 with different optical properties are provided at the same light emission point, so that it is possible to implement improvement of the luminance viewing angle characteristic and/or the chrominance viewing angle characteristic of the light of the first color.

For example, according to an actual application need, the light extraction layer 200 is set as below: the cathode light-emission side of one first sub-pixel 120 of the two adjacent first sub-pixels 120 is covered by one first light extraction unit 211, and the cathode light-emission side of the other first sub-pixel 120 of the two adjacent first sub-pixels 120 is covered by one second light extraction unit 212. In this case, it is also equivalent to a case where the first light extraction units 211 and the second light extraction unit 212 with different optical properties are provided at the same light emission point, so that it is also possible to implement improvement of the luminance viewing angle characteristic and/or the chrominance viewing angle characteristic of the light of the first color to a certain extent.

For example, the organic electroluminescence display substrate 10 further comprises the second sub-pixel 130 emitting light of the second color and the third sub-pixel 140 emitting light of the third color, each second sub-pixel 130 and each third sub-pixel 140 include the organic electroluminescence element 150.

Figure 8:
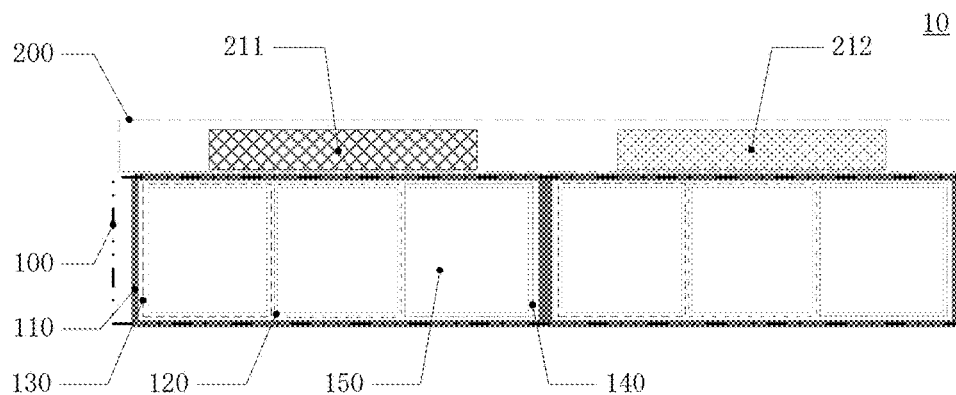
FIG. 8 is a cross-sectional schematic diagram of still another structure of the organic electroluminescence display substrate provided by the embodiments of the present disclosure.

For example, FIG. 8 is a cross-sectional schematic diagram of still another structure of the organic electroluminescence display substrate 10 provided by the embodiments of the present disclosure. As shown in FIG. 8, the organic electroluminescence display substrate 10 differs from the organic electroluminescence display substrate 10 shown in FIG. 6 in that the first light extraction unit 211 and the second light extraction unit 212 not only cover the cathode light-emission side of the first sub-pixel 120, but also at least partially cover the cathode light-emission sides of the second sub-pixel 130 and the third sub-pixel 140. Since the cathode light-emission sides of the two adjacent first sub-pixels 120 are respectively covered by the first light extraction unit 211 and the second light extraction unit 212 with different refractive indexes or different thicknesses, it is possible to improve the luminance viewing angle characteristics and/or the chrominance viewing angle characteristics of the light of the first color of the organic electroluminescence display substrate 10. Since the widths of the first light extraction unit 211 and the second light extraction unit 212 are increased, the difficulty in fabricating the light extraction layer 200 is reduced.

Figure 9:
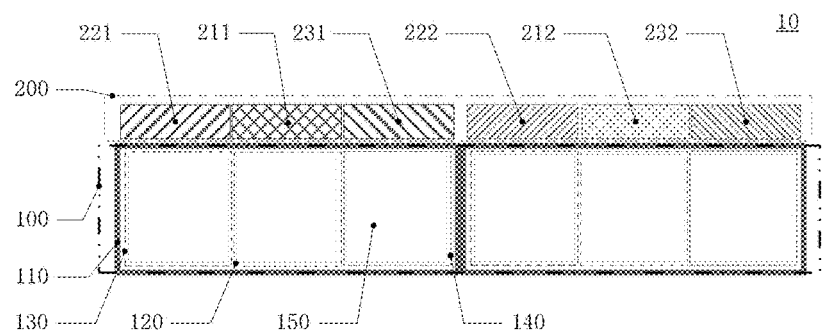
FIG. 9 is a cross-sectional schematic diagram of still another structure of the organic electroluminescence display substrate provided by the embodiments of the present disclosure.

For example, FIG. 9 is a cross-sectional schematic diagram of still another structure of the organic electroluminescence display substrate 10 provided by the embodiments of the present disclosure. As shown in FIG. 9, the organic electroluminescence display substrate 10 differs from the organic electroluminescence display substrate 10 shown in FIG. 6 in that the light extraction layer 200 further includes the plurality of third light extraction units 221 and the plurality of fourth light extraction unit 222 arranged in parallel. The optical property of the third light extraction unit 221 and the optical property of the fourth light extraction unit 222 are different from each other, for example, the third light extraction unit 221 and the fourth light extraction unit 222 have different refractive indexes or different thicknesses. The cathode light-emission sides of two adjacent second sub-pixels 130 are respectively covered by one third light extraction unit 221 and one fourth light extraction unit 222. As a result, it is possible to improve the luminance viewing angle characteristic and/or the chrominance viewing angle characteristic of the light of the second color of the organic electroluminescence display substrate 10.

For example, as shown in FIG. 9, the organic electroluminescence display substrate 10 further comprises the plurality of fifth light extraction units 231 and the plurality of sixth light extraction units 232 arranged in parallel. The optical property of the fifth light extraction unit 231 and the optical property of the sixth light extraction unit 232 are different from each other, for example, the fifth light extraction unit 231 and the sixth light extraction unit 232 have different refractive indexes or different thicknesses. The cathode light-emission sides of two adjacent third sub-pixels 140 are respectively covered by one fifth light extraction unit 231 and one sixth light extraction unit 232. As a result, it is possible to improve the luminance viewing angle characteristic and/or the chrominance viewing angle characteristic of the light of the third color of the organic electroluminescence display substrate 10.

For example, since the light extraction layer 200 shown in FIG. 9 have two light extraction units with different optical properties provided respectively with respect to the two adjacent first sub-pixels 120, two light extraction units with different optical properties provided respectively with respect to the two adjacent second sub-pixels 130 and two light extraction units with different optical properties provided respectively with respect to the two adjacent third sub-pixels 140, the luminance viewing angle characteristics and/or the chrominance viewing angle characteristics of the light of the first color, the light of the second color and the light of the third color are improved to a largest extent.

Figure 10:
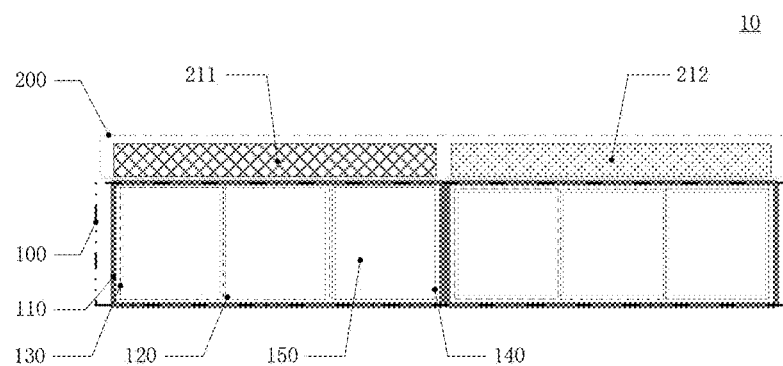
FIG. 10 is a cross-sectional schematic diagram of still another structure of the organic electroluminescence display substrate provided by the embodiments of the present disclosure.

For example, FIG. 10 is a cross-sectional schematic diagram of still another structure of the organic electroluminescence display substrate 10 provided by the embodiments of the present disclosure. As shown in FIG. 10, the organic electroluminescence display substrate 10 differs from the organic electroluminescence display substrate 10 shown in FIG. 6 in that the first light extraction unit 211 and the second light extraction unit 212 not only cover the cathode light-emission side of the first sub-pixel 120, but also cover the cathode light-emission sides of the second sub-pixel 130 and the third sub-pixel 140, that is to say, the first light extraction unit 211 covers one pixel 110 (for example, the pixel on the left side of FIG. 10), and the second light extraction unit 212 covers one pixel 110 (for example, the pixel on the right side of FIG. 10) adjacent to the first light extraction unit. Since the cathode light-emission sides of two adjacent first sub-pixels 120 are respectively covered by the first light extraction unit 211 and the second light extraction unit 212 with different refractive indexes or different thicknesses, the cathode light-emission sides of two adjacent second sub-pixels 130 are respectively covered by the first light extraction unit 211 and the second light extraction unit 212 with different refractive indexes or different thicknesses and the cathode light-emission sides of two adjacent third sub-pixels 140 are respectively covered by the first light extraction unit 211 and the second light extraction unit 212 with different refractive indexes or different thicknesses, the luminance viewing angle characteristics and/or the chrominance viewing angle characteristics of the light of the first color, the light of the second color and the light of the third color of the organic electroluminescence display substrate 10 are improved. Since the widths of the first light extraction unit 211 and the second light extraction unit 212 are further increased, the difficulty in fabricating the light extraction layer 200 is further reduced.

Figure 11:
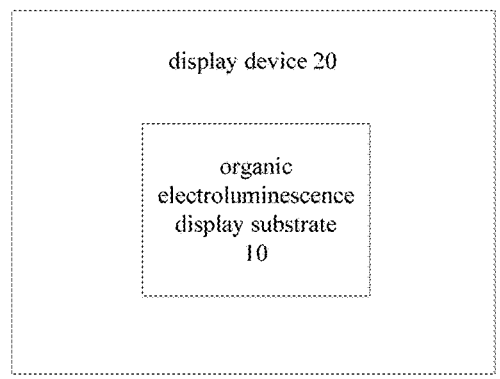
FIG. 11 is a schematic diagram of a display device provided by the embodiments of the present disclosure.

For example, the embodiments of the present disclosure provide a display panel, and the display panel comprises the organic electroluminescence display substrate 10 provided by any one of the embodiments of the present disclosure. For example, the embodiments of the present disclosure further provide a display device. FIG. 11 is a schematic diagram the display device 20 provided by the embodiments of the present disclosure. The display device 20 comprises the organic electroluminescence display substrate 10 provided by any one of the embodiments of the present disclosure. It should be noted that, for other parts of the display panel (for example, a glass cover-plate, and the like) and other parts of the display device, those ordinarily skilled in the art should understand that there are the same, which will not be repeated here, and should not be a limitation to the present disclosure. By providing at least two light extraction units with optical properties different from each other, improvement of the luminance viewing angle characteristic and/or the chrominance viewing angle characteristic of the organic electroluminescence display substrate, as well as of the display panel and the display device comprising the organic electroluminescence display substrate is implemented.

For example, based on a same inventive concept, the embodiments of the present disclosure further provide a fabrication method of an organic electroluminescence display substrate. The fabrication method of the organic electroluminescence display substrate comprises: forming a pixel array and forming a light extraction layer. The pixel array includes a plurality of pixels arranged in an array, each pixel includes a first sub-pixel emitting light of a first color, and each first sub-pixel includes an organic electroluminescence element. The light extraction layer covers on the pixel array, and for example, at least includes a plurality of first light extraction units and a plurality of second light extraction units arranged in parallel, an optical property of the first light extraction unit and an optical property of the second light extraction unit are different from each other. Cathode light-emission sides of two adjacent first sub-pixels are covered by at least one of the first light extraction units and at least one of the second light extraction units. For example, the cathode light-emission side of each first sub-pixel is covered by at least one of the first light extraction units and at least one of the second light extraction units, or the cathode light-emission sides of two adjacent first sub-pixels are respectively covered by at least one of the first light extraction units and at least one of the second light extraction units.

Figure 12:
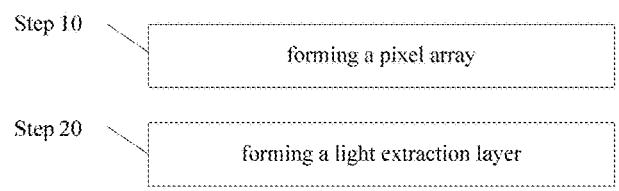
FIG. 12 is a flow chart of a fabrication method of an organic electroluminescence display substrate provided by the embodiments of the present disclosure.

For example, FIG. 12 is a flow chart of the fabrication method of the organic electroluminescence display substrate provided by the embodiments of the present disclosure. As shown in FIG. 12, the fabrication method for example comprises steps of:

Step S10: forming the pixel array;

Step S20: forming the light extraction layer.

For arrangement modes of the pixel array and the light extraction layer, the foregoing embodiments of the organic electroluminescence display substrate may be referred to, which will not be repeated here. By forming at least two light extraction units with optical properties different from each other on the cathode light-emission side of each first sub-pixel or respectively on the cathode light-emission sides of two adjacent first sub-pixels, the improvement of the luminance viewing angle characteristic and/or the chrominance viewing angle characteristic of the organic electroluminescence display substrate is implemented.

The embodiments of the present disclosure provide the organic electroluminescence display substrate, the display device, and the fabrication method of the organic electroluminescence display substrate; and the organic electroluminescence display substrate, by providing at least two light extraction units with optical properties different from each other, implements the improvement of the luminance viewing angle characteristic and/or the chrominance viewing angle characteristic.

Although the present disclosure is described in detail hereinbefore with general illustration and specific embodiments, based on the embodiments of the present disclosure, certain variations or modifications can be made thereto, which is obvious for those skilled in the art. Therefore, all such variations or modifications without departing from the spirit of the present disclosure are within the scope of the claims of the present disclosure.

The present application claims priority of the Chinese Patent Application No. 201611091447.X filed on Dec. 1, 2016, the disclosure of which are incorporated herein by its reference in its entirety as part of the present application.

The invention claimed is:

1. An organic electroluminescence display substrate, comprising:
   a pixel array, comprising a plurality of pixels arranged in an array, each of the pixels includes a first sub-pixel emitting light of a first color, and wherein the first sub-pixel includes an organic electroluminescence element; and
   a light extraction layer, covering the pixel array and at least including a plurality of first light extraction units and a plurality of second light extraction units, wherein an optical property of the first light extraction units and an optical property of the second light extraction units are different from each other, and the first light extraction units and the second light extraction units do not overlap each other in a direction perpendicular to the organic electroluminescence display substrate,
   wherein, cathode light-emission sides of two adjacent first sub-pixels are covered by at least one of the first light extraction units and at least one of the second light extraction units.

2. The organic electroluminescence display substrate according to claim 1, wherein, a cathode light-emission side of the first sub-pixel is covered by at least one of the first light extraction units and at least one of the second light extraction units, or the cathode light-emission sides of two adjacent first sub-pixels are respectively covered by at least one of the first light extraction units and at least one of the second light extraction units.

3. The organic electroluminescence display substrate according to claim 1, wherein the first light extraction units and the second light extraction units have different thicknesses or different refractive indexes.

4. The organic electroluminescence display substrate according to claim 3, wherein, the first light extraction units and the second light extraction units include a first unit layer, the second light extraction units further include a second unit layer, and the second unit layer covers the first unit layer.

5. The organic electroluminescence display substrate according to claim 1, wherein each of the pixels further includes a second sub-pixel emitting light of a second color and a third sub-pixel emitting light of a third color, wherein the second sub-pixel and the third sub-pixel include corresponding organic electroluminescence elements.

6. The organic electroluminescence display substrate according to claim 5, wherein the second sub-pixel is covered by at least one of the first light extraction units and at least one of the second light extraction units, the third sub-pixel is covered by at least one of the first light extraction units and at least one of the second light extraction units, and cathode light-emission sides of any two adjacent sub-pixels among the first sub-pixel, the second sub-pixel, and the third sub-pixel are at least partially covered by a same first light extraction unit or a same second light extraction unit.

7. The organic electroluminescence display substrate according to claim 5, further comprising a plurality of third light extraction units and a plurality of fourth light extraction units arranged in parallel, wherein an optical property of the third light extraction units and an optical property of the fourth light extraction units are different from each other,
   wherein, a cathode light-emission side of each second sub-pixel is covered by at least one of the third light extraction units and at least one of the fourth light extraction units, or cathode light-emission sides of two adjacent second sub-pixels are respectively covered by at least one of the third light extraction units and at least one of the fourth light extraction units.

8. The organic electroluminescence display substrate according to claim 7, further comprising a plurality of fifth light extraction units and a plurality of sixth light extraction units arranged in parallel, wherein an optical property of the fifth light extraction units and an optical property of the sixth light extraction units are different from each other,
   wherein, a cathode light-emission side of the third sub-pixel is covered by at least one of the fifth light extraction units and at least one of the sixth light extraction units, or cathode light-emission sides of two adjacent third sub-pixels are respectively covered by at least one of the fifth light extraction units and at least one of the sixth light extraction units.

9. The organic electroluminescence display substrate according to claim 8, wherein the optical property of the first light extraction units, the optical property of the third light extraction units, and the optical property of the fifth light extraction units are the same, and the optical property of the second light extraction units, the optical property of the fourth light extraction units, and the optical property of the sixth light extraction units are the same.

10. The organic electroluminescence display substrate according to claim 1, wherein, cathode light-emission sides of two adjacent pixels are respectively covered by at least one of the first light extraction units and at least one of the second light extraction units.

11. The organic electroluminescence display substrate according to claim 1, wherein the organic electroluminescence element is an organic electroluminescence element of top-emission type or an organic electroluminescence element of bilateral-emission type.

12. A display panel, comprising the organic electroluminescence display substrate according to claim 1.

13. A display device, comprising the display panel according to claim 12.

14. A fabrication method of an organic electroluminescence display substrate, comprising:
   forming a pixel array, comprising a plurality of pixels arranged in an array, each of the pixels includes a first sub-pixel emitting light of a first color, wherein the first sub-pixel includes an organic electroluminescence element; and
   forming a light extraction layer, covering the pixel array and at least including a plurality of first light extraction units and a plurality of second light extraction units, wherein an optical property of the first light extraction units and an optical property of the second light extraction units, are different from each other, and the first light extraction units and the second light extraction units do not overlap each other in a direction perpendicular to the organic electroluminescence display substrate,
   wherein, cathode light-emission sides of two adjacent first sub-pixels are covered by at least one of the first light extraction units and at least one of the second light extraction units.

15. The fabrication method of the organic electroluminescence display substrate according to claim 14, wherein a cathode light-emission side of the first sub-pixel is covered by at least one of the first light extraction units and at least one of the second light extraction units, or the cathode light-emission sides of two adjacent first sub-pixels are respectively covered by at least one of the first light extraction units and at least one of the second light extraction units.

16. The fabrication method of the organic electroluminescence display substrate according to claim 14, wherein the first light extraction units and the second light extraction units have different thicknesses or different refractive indexes.

17. The fabrication method of the organic electroluminescence display substrate according to claim 14, wherein the first light extraction units and the second light extraction units include a first unit layer, the second light extraction units further include a second unit layer, and the second unit layer covers the first unit layer.

18. The fabrication method of the organic electroluminescence display substrate according to claim 14, wherein each of the pixels further includes a second sub-pixel emitting light of a second color and a third sub-pixel emitting light of a third color, the second sub-pixel and the third sub-pixel include corresponding organic electroluminescence element.

19. The fabrication method of the organic electroluminescence display substrate according to claim 18, wherein, the second sub-pixel is covered by at least one of the first light extraction units and at least one of the second light extraction units, the third sub-pixel is covered by at least one of the first light extraction units and at least one of the second light extraction units, and cathode light-emission sides of any two adjacent sub-pixels among the first sub-pixel, the second sub-pixel, and the third sub-pixel are at least partially covered by a same first light extraction unit or a same second light extraction unit.

20. The fabrication method of the organic electroluminescence display substrate according to claim 18, further comprising: forming a plurality of third light extraction units and a plurality of fourth light extraction units arranged in parallel, wherein an optical property of the third light extraction units and an optical property of the fourth light extraction units are different from each other,
wherein a cathode light-emission side of the second sub-pixel is covered by at least one of the third light extraction units and at least one of the fourth light extraction units, or cathode light-emission sides of two adjacent second sub-pixels are respectively covered by at least one of the third light extraction units and at least one of the fourth light extraction units.

* * * * *